United States Patent [19]

Meier et al.

[11] Patent Number: 5,550,345

[45] Date of Patent: Aug. 27, 1996

[54] PROCESS AND DEVICE FOR WELDING SHEETS BY LASER TO FORM COMPOUND SHEETS

[75] Inventors: Markus Meier, Gächlinge; Werner Urech, Kaiserstuhl; Karl Wueger, Uster, all of Switzerland

[73] Assignee: Elpatronic AG, Zug, Switzerland

[21] Appl. No.: 33,050

[22] Filed: Mar. 18, 1993

[30] Foreign Application Priority Data

| Apr. 12, 1992 | [CH] | Switzerland | 01173/92 |
| Apr. 13, 1992 | [CH] | Switzerland | 01211/92 |
| Feb. 25, 1993 | [CH] | Switzerland | 00573/93 |

[51] Int. Cl.$^6$ .................................................... B23K 26/00
[52] U.S. Cl. .................................. 219/121.63; 219/121.64
[58] Field of Search ........................ 219/121.63, 121.64, 219/121.83; 156/304.1, 304.5, 304.6; 228/173.2, 173.6, 4.1, 5.1; 72/252.5

[56] References Cited

U.S. PATENT DOCUMENTS

| 4,872,940 | 10/1989 | Strum et al. ................. 219/121.63 |
| 5,205,468 | 4/1993 | Büdenbender ................. 219/121.64 |

FOREIGN PATENT DOCUMENTS

| 0058135 | 11/1986 | European Pat. Off. . |
| 3909620 | 9/1990 | Germany . |
| 61-202789 | 9/1986 | Japan .................. 219/121.64 |
| 61-279383 | 12/1986 | Japan .................. 219/121.64 |
| 61-279385 | 12/1986 | Japan .................. 219/121.64 |
| 1-118389 | 5/1989 | Japan .................. 219/121.64 |
| 8403059 | 8/1984 | WIPO . |

OTHER PUBLICATIONS

Literature re Laser Blank Welding Review by John K. Baysore, pp. 1–6, 13 pages of attachments.
Literature re High Speed Laser Welding of Deep Drawing Low Carbon Steel by G. L. Neiheisel, Research & Technology, Armco, Inc., pp. 150, 154 and 156.
Laserschweissen—eine neue Verfahrenstechnik bei der Verarbeitung von kaltgewalzten Feinblechen by H. Schütz, J. Szinyur, K. M. Radlmayr, H. Mildner und W. Schiefermüller, 1 sheet.
Qualitätssicherung von $CO_2$-Laserstrahl-Schweissarbeiten Nahtvorbereitung und konstruktive Hinweise, Merkblatt DVS 3203 Teil 4, (Dezember 1988), Seite 1–6.
Focus on Lasers, Reducing cost and weight with Laser Blank Welding, 2 sheets.

*Primary Examiner*—Teresa J. Walberg
*Assistant Examiner*—Gregory L. Mills
*Attorney, Agent, or Firm*—McCormick, Paulding & Huber

[57] ABSTRACT

The sheets which are to be butt welded are positioned with their edges in contact with one another. To reduce the gap to a width acceptable for laser welding, at least one sheet is plastically deformed along the line of the joint so that material flows towards the gap, reducing the width of the gap. In this way, sheets cut to size with much less precision can be welded together.

20 Claims, 7 Drawing Sheets

$S1 \leq S$
$S1 \neq$ const.

$S1 \cong S$
$S2 \leq S$
$S2 \neq$ const.

FIG. 8
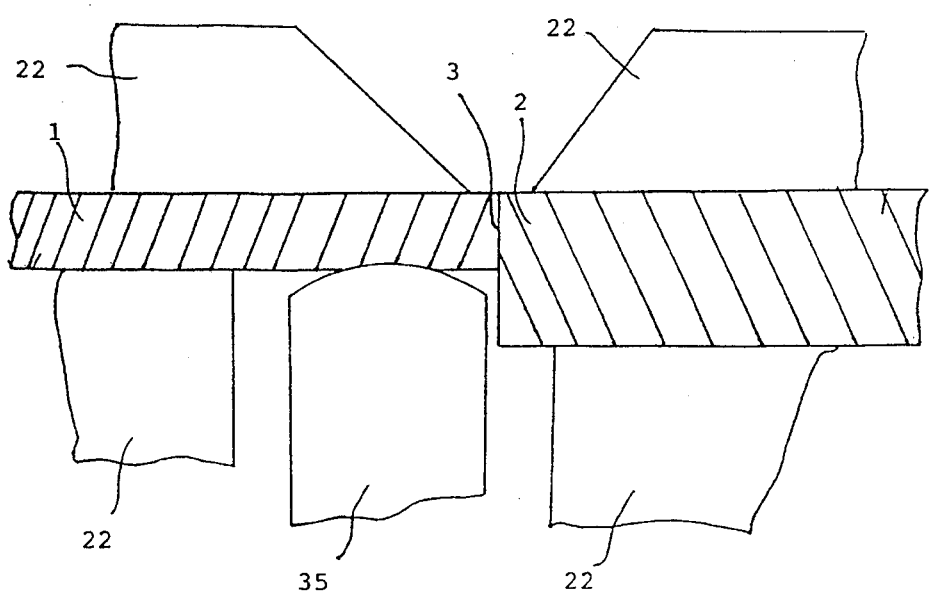
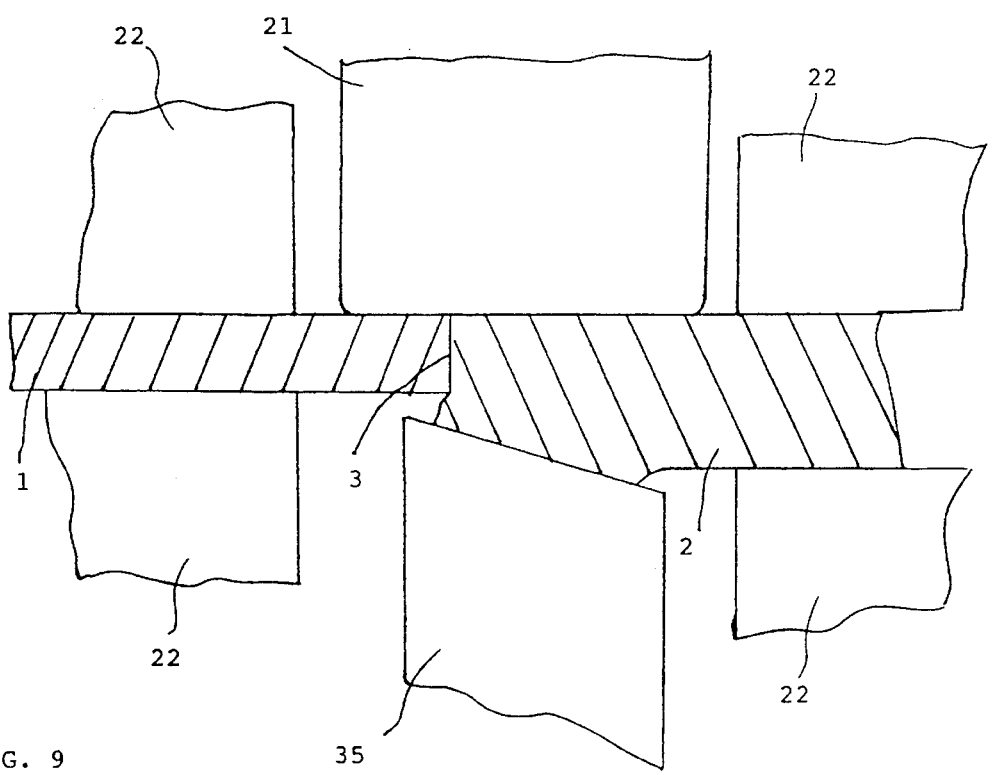
FIG. 9

PROCESS AND DEVICE FOR WELDING SHEETS BY LASER TO FORM COMPOUND SHEETS

BACKGROUND OF THE INVENTION

This invention relates to a process for welding sheets by laser to form compound sheets. The invention further relates to a device for carrying out the process.

The joining together of sheets by laser welded butt joints is known. The joined sheets are called a compound sheet. With laser butt welding, the problem arises that the sheets have to be located edge to edge very precisely and the gap between them before welding must be small. For a good quality weld, the width of gap may usually be only 0.05 to 0.08 mm. This means that each of the two sheets may deviate only 0.04 mm from straight. With the extended welds which occur in compound sheets, it is extremely laborious to obtain such a narrow width of gap along the entire length of the located edges of the sheets to be welded. It is true that precision shears which are capable of making e.g. a 2.5 m long cut with the required accuracy are obtainable; but such shears are extremely costly. Other known methods of edge preparation such as milling, grinding or laser cutting involve considerable additional expenditure in terms of production time and cost.

SUMMARY OF THE INVENTION

The invention therefore has the fundamental object of providing a laser welding process for which such exact cutting and positioning of the sheets are not necessary and/or for which the requirements are greatly reduced, and which therefore can be carried out much more quickly and cheaply.

This is accomplished in a process of the type stated by plastically deforming at least one of the sheets ahead of or within the welding zone to reduce the width of the gap between the sheets.

With the process according to the invention, the sheets can be cut to size with considerably less precision. An accuracy of approximately 0.15 mm per sheet is sufficient. This yields a maximum gap of some 0.3 mm which is essentially eliminated by the deformation of one or both sheets in accordance with the invention. That is to say, the deformation yields a gap which does not exceed the maximum width of 0.08 mm.

It is also part of the fundamental object of the invention to provide a device for carrying out the process.

BRIEF DESCRIPTION OF THE DRAWINGS

Embodiments of the invention will now be explained in detail by way of example, with reference to the drawings, in which:

FIG. 8 also shows a further embodiment of the invention;

FIG. 9 shows an embodiment with an angled pinch roller;

DESCRIPTION OF THE PREFERRED EMBODIMENTS

Figure 1:
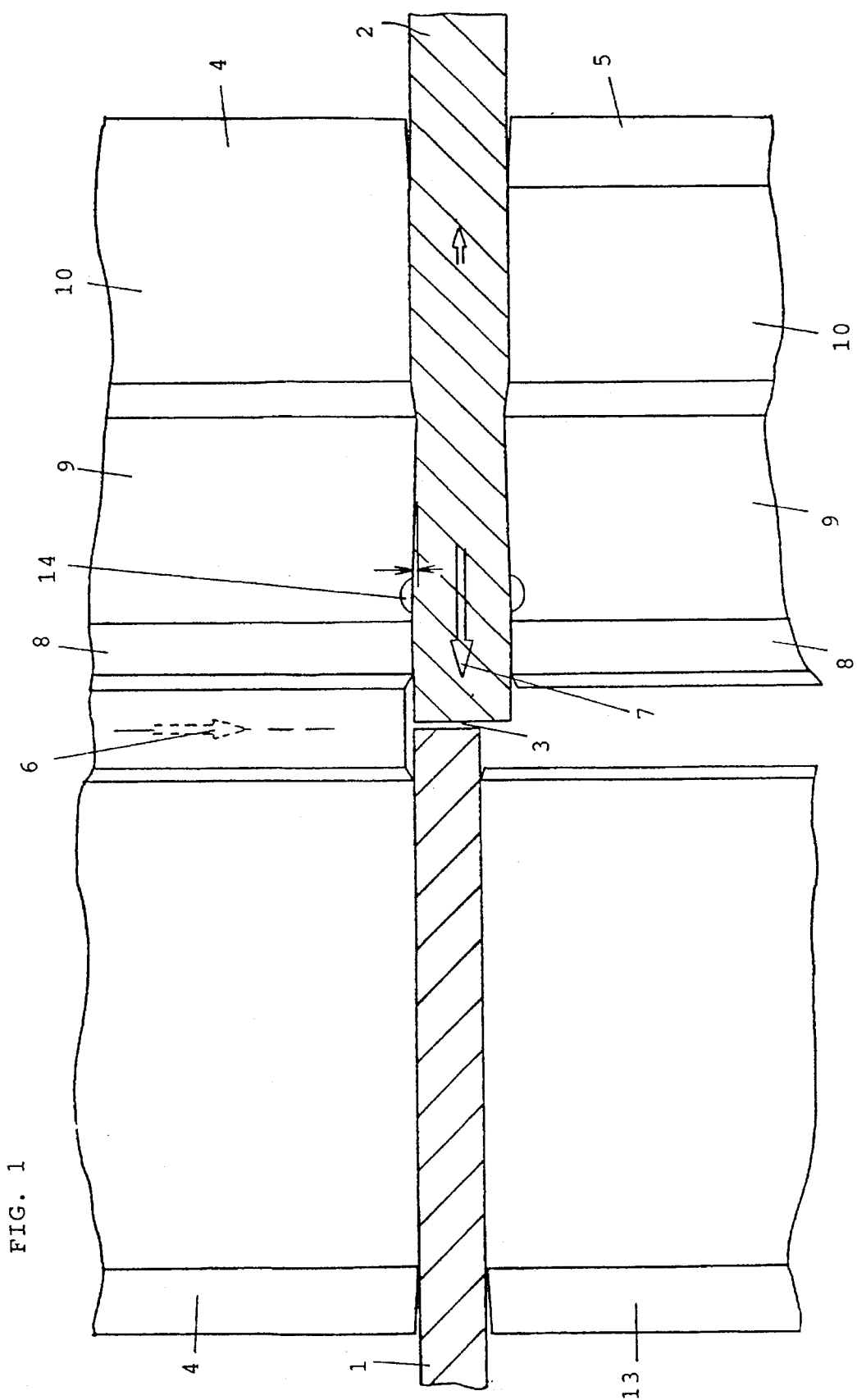
FIG. 1 shows a vertical section through two sheets of unequal thickness which are to be welded together.

FIG. 1 shows a vertical section through two sheets 1 and 2 which are to be welded together. The two sheets 1,2, one of which is thicker than the other, have their edges abutting one another, and are butt welded together in this position. Welding is performed in a known manner by a laser beam 6 with a focused cross-section of e.g. 0.2 mm diameter in the welding zone. In order for the weld to be of the required quality, and free from imperfections, the gap 3 between the adjoining sheets 1,2 must not exceed a width of 0.08 mm in the welding zone. If the gap is wider than this, sagging of the weld or breakthrough of the laser beam occurs. By using the process according to the invention, however, the gap between the sheets can initially be considerably larger, e.g. 0.3 mm. This means that the sheets can be cut to size with much less precision. According to the invention, one or both of the sheets is or are plastically deformed ahead of the welding zone or within the welding zone, reducing the width of the gap so that the maximum permissible width of gap is not exceeded. As shown in FIG. 1, the thicker of the two sheets has its thickness reduced by two pinch rollers 4 and 5. This causes material to flow mainly in the direction of the arrow Y, reducing the width of the gap. Each of the two pinch rollers has a zone 8 in which the pinch roller is in contact with the sheet, a zone 9 which penetrates into the sheet to bring about the displacement of material, and a further zone 10 which is in contact with the sheet. In this example the zone 9 is designed so that the depth of penetration of the roller into the sheet increases with increasing distance from the gap. This is to ensure that the flow of material is mainly in the direction of the arrow Y, and not in the opposite direction, which is undesired. With the arrangement illustrated by way of example, it will be found that with a thickness of sheet 2 of 3 mm and a width of zone 9 of 6 mm, a nip of 0.1 mm of the pinch roller yields a displacement of material in the region of the gap of approximately 0.2 mm. The sheet is plastically deformed under a load of 1 to 2 tonnes. For the thinner sheet 1, only a guide zone on the roller 4 and a guide roller 13 are provided. However, it would also be possible for only sheet 1 to be plastically deformed.

At points at which the sheets are already in contact with one another, plastic deformation of one or both sheets is in itself unnecessary. If such deformation does occur, it causes undesired forces to act on the sheets, forcing them apart. Therefore, a peripheral groove 14 can be provided e.g. in zone 9 of each pinch roller, which in this case allows the flowing material to be diverted into this recess to reduce the undesired transverse forces. A preferable alternative, however, is to control the deformation force exerted on the pinch rollers by optically or mechanically detecting the width of the gap ahead of the deformation zone and increasing or reducing the force acting on the pinch rollers accordingly, so that at points where the width of the gap is already very small or the sheets are already in contact with one another only a small force is exerted on the pinch rollers. Instead of varying the force on the rollers, it is also possible to vary their axial position, allowing deeper or shallower penetration into the sheet.

After the material has been deformed to reduce the width of gap, the gap is usually no longer straight. Therefore in a further development of the invention the laser beam is controlled to track the line of the gap. The line of the gap is preferably optically, or by other means, measured in relation to a fixed system of coordinates, and the laser beam is deflected in accordance with the signals from the measuring device, preferably by the movement of one or more mirrors, away from a datum position within the abovementioned system of coordinates, so that it follows the measured line of the gap. This ensures that the welded seam is centred on the as yet unwelded gap. If when sheets of different thicknesses are being welded it is desired to shift the beam towards the thicker of the two sheets; this can be accomplished by a correction of the output signals in the data processing stage.

Figure 2:
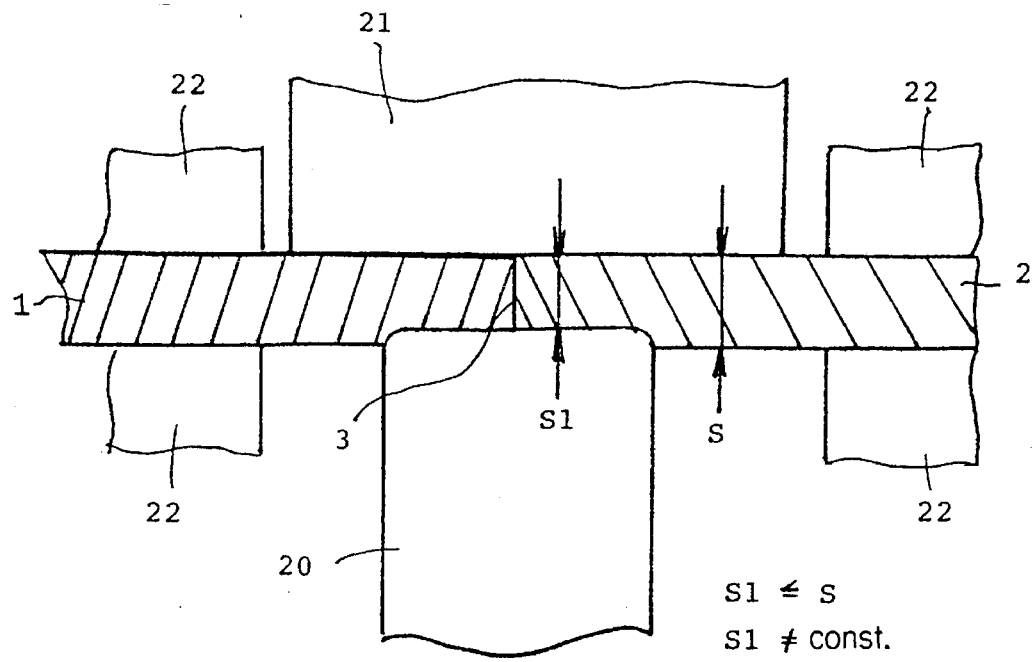
FIG. 2 shows a vertical section through two sheets of equal thickness which are to be welded together.

FIG. 2 shows two sheets 1 and 2 of equal thickness. A narrower pinch roller 20 underneath the sheets penetrates into the material of both sheets. Above the sheets a wider roller or rail 21 which does not penetrate into the sheets is provided. Lateral sheet guides 22 are also provided.

Figure 3:
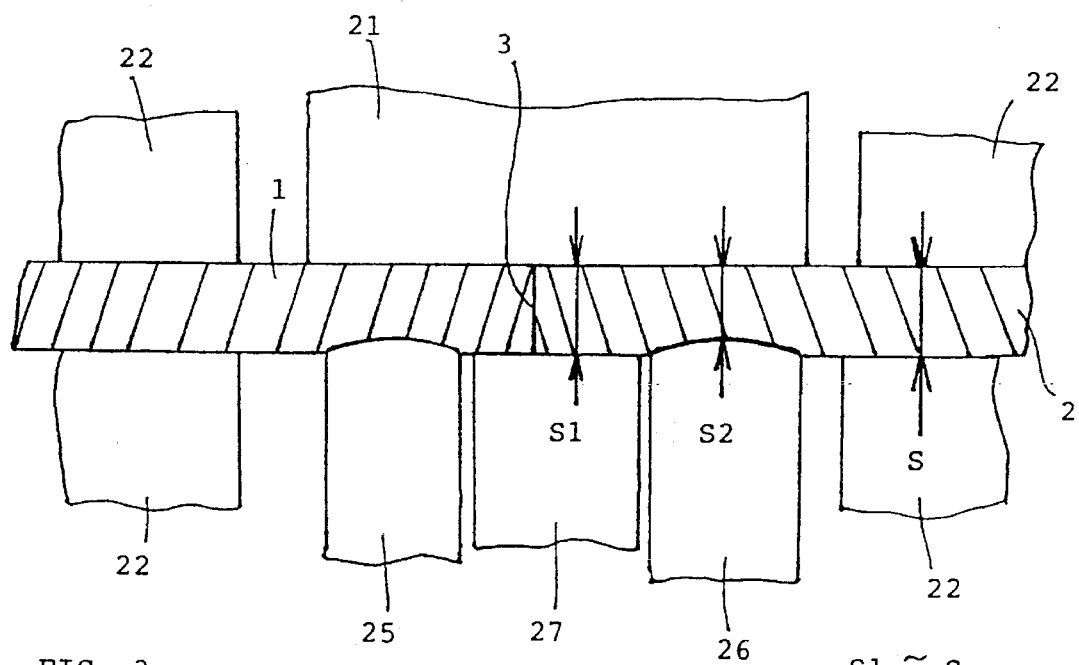
FIG. 3 shows a further embodiment with a number of pinch rollers.

FIG. 3 shows a further embodiment with two sheets 1 and 2 of equal thickness. Here again a roller or rail 21 is provided above the sheets. Underneath the sheets 1,2 are two lateral rollers 25 and 26 which penetrate into the material as pinch rollers and locally reduce the thickness of the sheets. A roller or rail 27 is provided centrally between these pinch rollers, to support the sheets.

Figure 4:
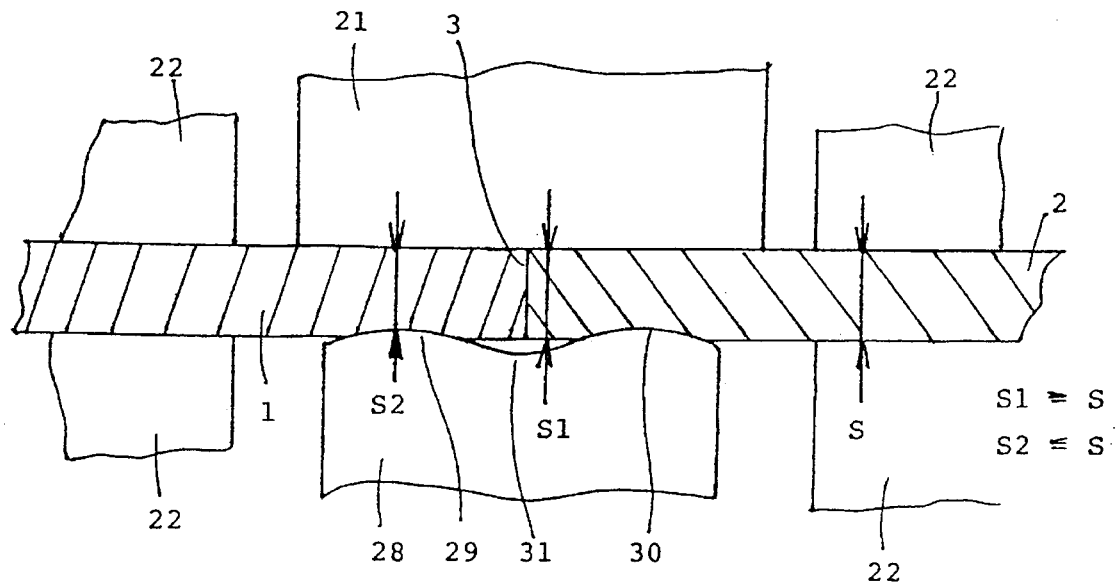
FIG. 4 shows a further embodiment of the invention.

FIG. 4 shows a further embodiment in which a bottom roller 28 is provided with penetration zones 29 and 30, respectively, on either side of the gap 3, and the material is plastically deformed at each of these zones. The roller is provided with a central waist 31.

Figure 5:
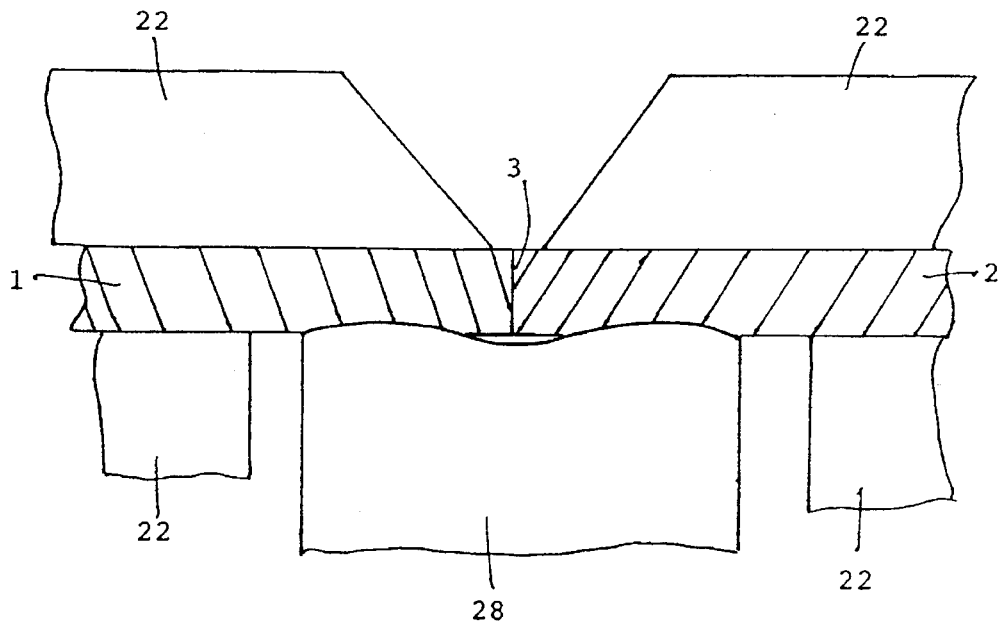
FIG. 5 also shows a further embodiment of the invention.

FIG. 5 shows a similar embodiment to FIG. 4, the upper roller or rail being replaced with a different configuration of the guides 22.

Figure 6:
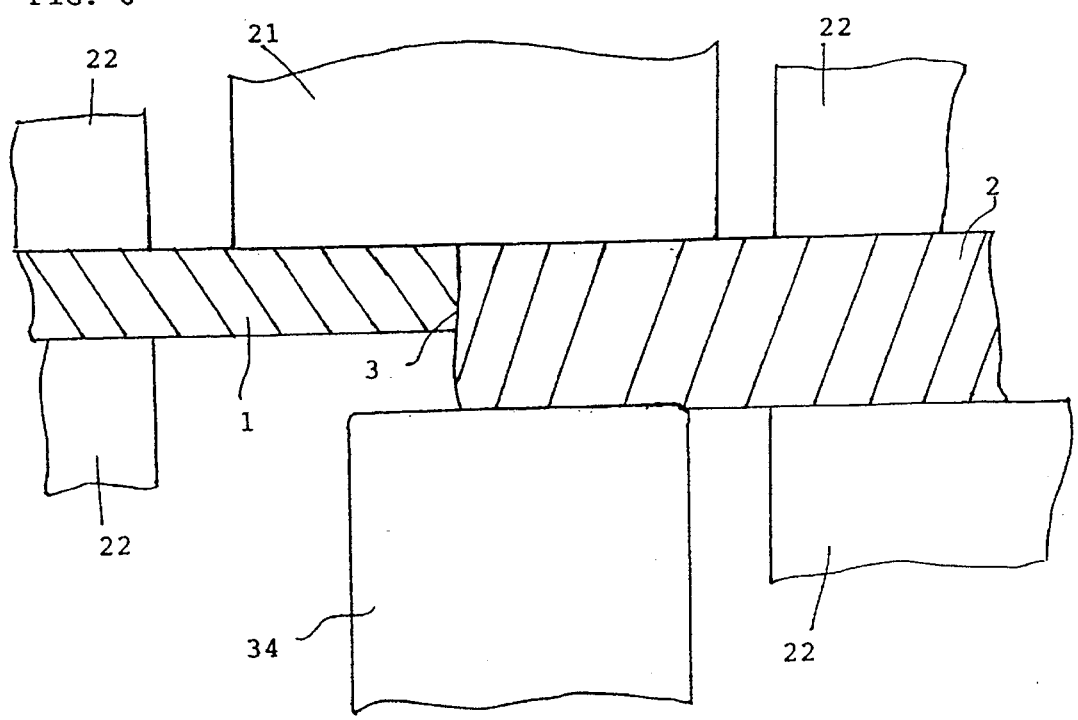
FIG. 6 shows a further embodiment for welding sheets of different thicknesses.

FIG. 6 shows a further embodiment, in which two sheets of different thicknesses are involved. Underneath the sheets there is a pinch roller 34 which penetrates into the material of the thicker sheet 2. Above the sheets, a roller or rail 21 is provided to serve as a guide.

Figure 7:
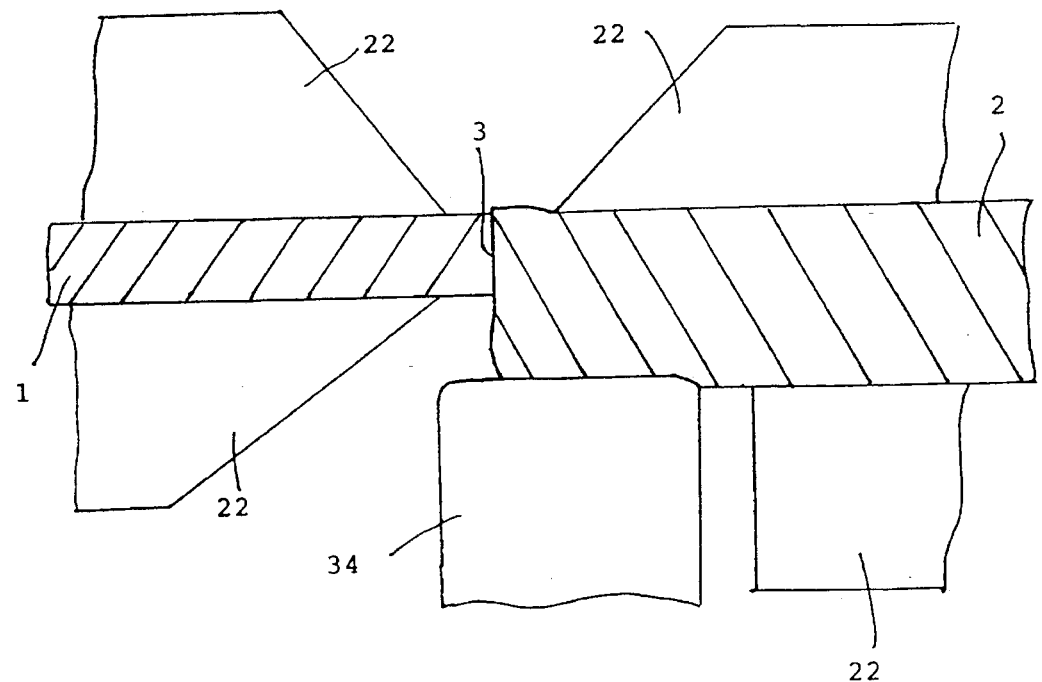
FIG. 7 shows a further embodiment of the invention.

FIG. 7 shows a further configuration of the embodiment according to FIG. 6. In this case the top roller or rail is replaced with a configuration of the guides 22 corresponding to FIG. 5.

FIG. 8 shows a similar embodiment to FIG. 7, but in this case it is the thinner sheet 1 which is deformed.

FIG. 9 shows an embodiment with an angled roller 35.

Figure 10:
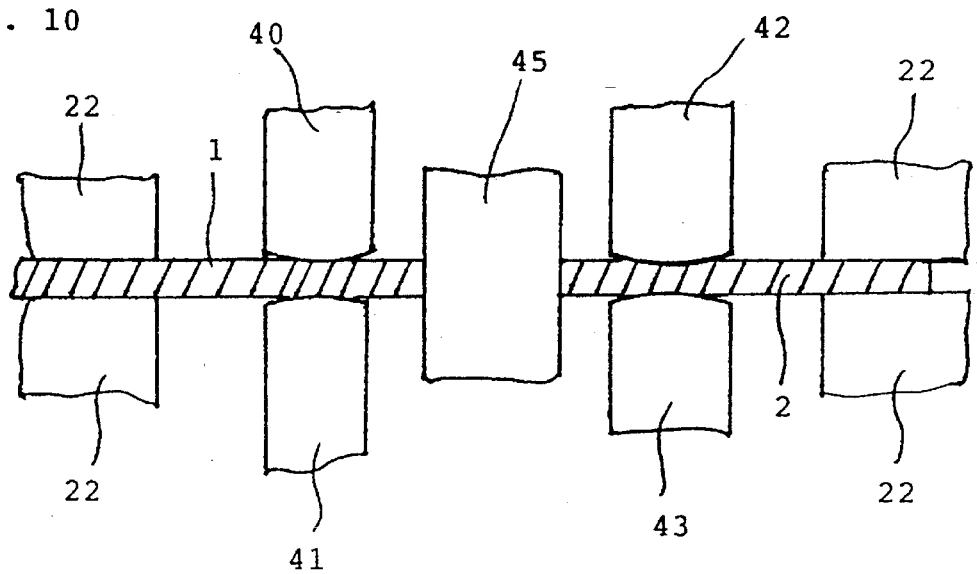
FIG. 10 shows an embodiment with a stop bar.

FIG. 10 shows another way of carrying out the invention. In this case the sheets 1,2 are first of all separately deformed by means of pinch rollers 40,41 and 42,43 respectively, against a fixed stop 45. By plastic deformation of the sheets, each sheet is given a very precisely straight edge at this stop face. This operation is performed ahead of the welding zone, and the two straight edges of the sheets are brought into contact in a further stage prior to welding, e.g. by removing the stop 45 and bringing the sheets together by moving them sideways.

Figure 11:
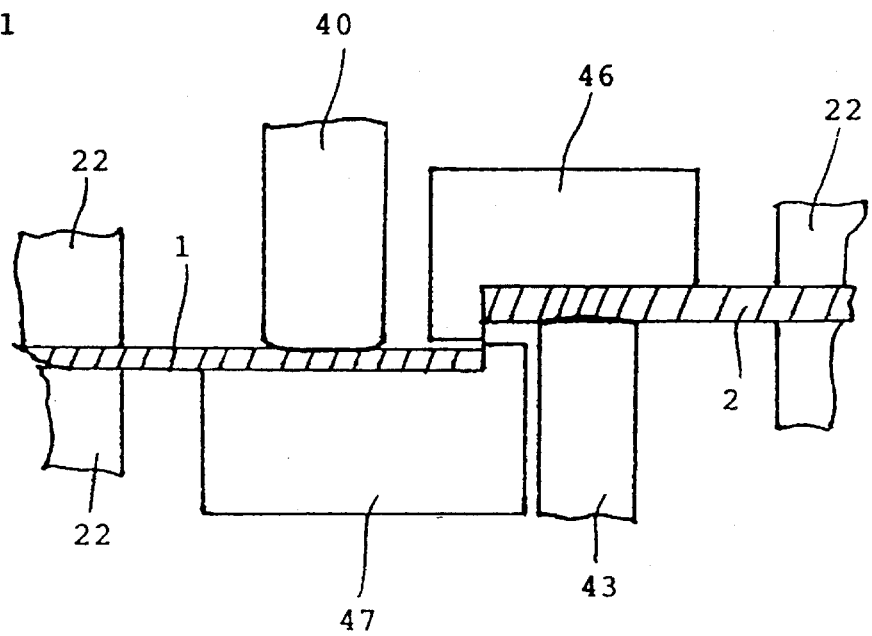
FIG. 11 also shows an embodiment with a stop bar.

FIG. 11 shows a further embodiment of the invention with two fixed stops 46,47 and with only one pinch roller to each sheet.

Figure 12:
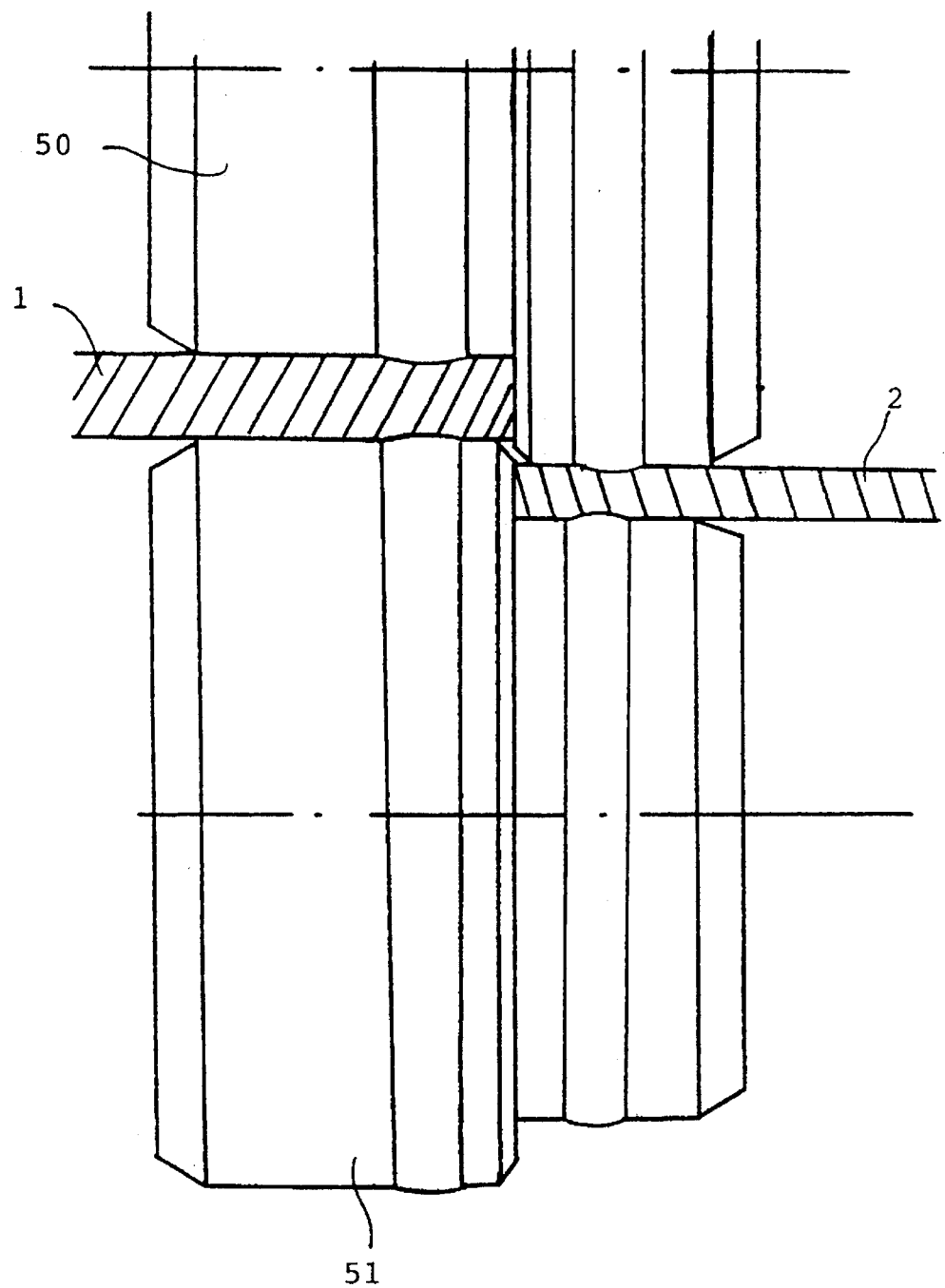
FIG. 12 shows an embodiment in which the pinch rollers themselves act as stops.

FIG. 12 shows an embodiment with two pinch rollers 50,51 both possessing shoulders which act as stops for the sheets 1 and 2 respectively. In this variant, apart from the slight vertical offset in the pinching stage, the sheets are positioned correctly with respect to one another, i.e. the sheets 1,2 do not need to be shifted sideways.

The clamped sheets may be fed by a conveyor system through the stationary forming unit to the laser beam. Alternatively, the clamped sheets may be stationary and the forming unit may be traversable along the joint line. In this case, a traversable focusing lens for the laser beam is preferably also provided.

We claim:

1. Process for butt welding sheets by a laser to form compound sheets, each sheet having a thickness and defining a gap having a width when edges of the sheets are positioned in an abutting relationship, comprising the step of:

plastically deforming at least one of the sheets prior to the sheets being welded and ahead of a welding zone in order to reduce the width of the gap between the sheets, the deformation being controlled as a function of the width of the gap ahead of a deformation zone caused by the deformation.

2. Process according to claim 1, characterized in that during the step of deforming the thickness of the sheet alongside the gap is reduced by the deformation in such a way as to cause material to flow towards the gap.

3. Process according to claim 2, characterized in that during the step of deforming the thickness of the sheet alongside the gap is reduced in a non-uniform manner.

4. Process according to one of claim 2, characterized in that during the step of deforming a zone is provided alongside the gap in which provision is made for the sheet to be thickened in the course of the deformation, so as to prevent the sheets from being forced apart by the material flow.

5. Process according to claim 1, characterized in that during the step of deforming, deformation is effected by means of at least one pinch roller arranged above or below the sheet.

6. Process according to claim 5, characterized in that during the step of deforming, the sheets, which are vertically offset with respect to one another, are each deformed against a stop during the step of deforming.

7. Process according to claim 6, characterized in that the stop is defined by a shoulder on the at least one pinch roller.

8. Process according to claim 1, characterized in that during the step of deforming a laser beam produced by the laser is controlled to track the gap resulting from the deformation.

9. Process according to claim 1, characterized in that during the step of deforming the deformation takes place within the sheet and immediately adjacent to an edge of the sheet that abuts the other sheet.

10. Device for carrying out the process of butt welding sheets by a laser, each sheet having a thickness and defining a gap having a width when edges of the sheets are positioned in an abutting relationship, comprising:

a holding system which fixes the sheets with their edges held in contact with one another;

a deformation system which plastically deforms at least one of the sheets ahead of a welding zone as the sheets are welded by a laser;

a detection system for detecting the width of the gap ahead of a deformation zone in a sheet caused by the deformation; and a control arrangement, the control arrangement controlling the deformation system for deforming a sheet as a function of the detected gap width.

11. Device according to claim 10, characterized in that the deformation system has at least one pinch roller whereby the thickness of at least one of the sheets is reduced.

12. Device according to claim 11, characterized in that the pinch roller has a portion with a tapered outer surface so that thickness of the sheet is reduced in a non-uniform manner.

13. Device according to claim 11, characterized in that the pinch roller has a peripheral recess to allow thickening of the sheet within the recess.

14. Device according to claim 11, further comprising:

a control arrangement for controlling the position of the pinch roller along a pinch roller axis perpendicular with respect to a surface of the sheet and for correspondingly controlling the reduction in sheet thickness.

15. Device according to one of claim 11, characterized in that a lower pinch roller and an upper pinch roller are provided, each possessing a stop face for one of the sheets.

16. Device according to claim 10, characterized in that the control arrangement controls a force exerted by the deformation system on the sheet.

17. Device according to claim 10, further comprising:

an optical or mechanical detection system for detecting a line defined by the gap after deformation, and a tracking arrangement responding to the detection system for guiding a laser beam produced by the laser so that the laser beam follows the line defined by the gap.

18. Device according to one of claim 10, characterized in that the deformation system has a bulbous pinch body for deforming at least one of the sheets.

19. Process for butt welding sheets by a laser to form compound sheets, each sheet having a thickness and the sheets defining a gap having a width when edges of the sheets are positioned in an abutting relationship, comprising the step of:

plastically deforming at least one of the sheets as the sheets are welded and ahead of or within a welding zone in order to reduce the width of the gap between the sheets; and detecting the width of the gap between abutting sheets at points along the gap;

wherein the deformation is controlled as a function of the width of the gap ahead of a deformation zone in a sheet caused by the deformation.

20. Device for carrying out the process of butt welding sheets by a laser, each sheet having a thickness and defining a gap having a width when edges of the sheets are positioned in an abutting relationship, comprising:

a holding system which fixes the sheets with their edges held in contact with one another;

a deformation system which plastically deforms at least one of the sheets ahead of or within a welding zone as the sheets are welded;

a detection system for detecting the width of the gap ahead of a deformation zone in a sheet caused by the deformation; and a control arrangement controlling the deformation system for deforming a sheet as a function of the detected width of the gap.

* * * * *

UNITED STATES PATENT AND TRADEMARK OFFICE
CERTIFICATE OF CORRECTION

PATENT NO. : 5,550,345
DATED : August 27, 1996
INVENTOR(S) : Markus Meier, Werner Urech and Karl Wueger It is certified that error appears in the above-indentified patent and that said Letters Patent is hereby corrected as shown below:

Column 4, Line 26, delete "one of".

Signed and Sealed this

Twenty-sixth Day of November 1996

Attest:

BRUCE LEHMAN

Attesting Officer      Commissioner of Patents and Trademarks